United States Patent
Rodriguez et al.

(10) Patent No.: US 11,755,048 B2
(45) Date of Patent: Sep. 12, 2023

(54) DIFFERENTIAL TO SINGLE-ENDED HIGH BANDWIDTH COMPENSATOR

(71) Applicant: Intel Corporation, Santa Clara, CA (US)

(72) Inventors: Sergio Carlo Rodriguez, Hillsboro, OR (US); Alexander Lyakhov, Portland, OR (US); Gerhard Schrom, Hillsboro, OR (US); Keith Hodgson, Hillsboro, OR (US); Sarath S. Makala, Hillsboro, OR (US); Sidhanto Roy, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/220,802

(22) Filed: Apr. 1, 2021

(65) Prior Publication Data

US 2021/0223811 A1 Jul. 22, 2021

Related U.S. Application Data

(63) Continuation of application No. 16/575,259, filed on Sep. 18, 2019, now Pat. No. 10,976,764.

(51) Int. Cl.
*H02M 3/157* (2006.01)
*G05F 1/652* (2006.01)
(Continued)

(52) U.S. Cl.
CPC .............. *G05F 1/652* (2013.01); *G05F 1/44* (2013.01); *H02M 3/157* (2013.01); *H02M 1/0025* (2021.05); *H03M 1/66* (2013.01)

(58) Field of Classification Search
CPC .... H02M 3/156; H02M 3/158; H02M 3/1588; H02M 3/155; H02M 3/1582; H02M 3/157; H02M 3/1563; H02M 3/1584
See application file for complete search history.

(56) References Cited

U.S. PATENT DOCUMENTS 9,046,552 B2 6/2015 Paillet et al.
10,008,928 B2 6/2018 Bawa
(Continued)

FOREIGN PATENT DOCUMENTS

CN 104638885 A1 * 12/2014 ............ H02M 3/156
WO WO-2019063505 A1 * 4/2019 ............ H05B 33/08

OTHER PUBLICATIONS

Final Office Action from U.S. Appl. No. 16/575,259 notified Aug. 17, 2020, 14 pgs.
(Continued)

*Primary Examiner* — Bryan R Perez
(74) *Attorney, Agent, or Firm* — Schwabe, Williamson & Wyatt, P.C.

(57) ABSTRACT

A compensator is described with higher bandwidth than a traditional differential compensator, lower area than traditional differential compensator (e.g., 40% lower area), and lower power than traditional differential compensator. The compensator includes a differential to single-ended circuitry that reduces the number of passive devices used to compensate an input signal. The high bandwidth compensator allows for faster power state and/or voltage transitions. For example, a pre-charge technique is applied to handle faster power state transitions that enables aggressive dynamic voltage and frequency scaling (DVFS) and voltage transitions. The compensator is configurable in that it can operate in voltage mode or current mode.

19 Claims, 8 Drawing Sheets

(51) Int. Cl.
G05F 1/44 (2006.01)
*H03M 1/66* (2006.01)
*H02M 1/00* (2006.01)

(56) References Cited

U.S. PATENT DOCUMENTS

| | | | |
|---|---|---|---|
| 10,184,961 B2 | 1/2019 | Schrom et al. | |
| 2007/0262761 A1* | 11/2007 | Ishigaki | H02M 3/156 323/282 |
| 2009/0284235 A1 | 11/2009 | Weng et al. | |
| 2014/0375227 A1* | 12/2014 | Yoshinaga | H05B 45/14 315/246 |
| 2016/0087595 A1* | 3/2016 | Gopalraju | H02M 1/08 330/260 |
| 2016/0111061 A1 | 4/2016 | Thenus et al. | |
| 2017/0331370 A1 | 11/2017 | Arbetter | |
| 2020/0236761 A1* | 7/2020 | Shi | H05B 45/325 |

OTHER PUBLICATIONS

Non-Final Office Action from U.S. Appl. No. 16/575,259 notified Mar. 12, 2020, 14 pgs.

Notice of Allowance from U.S. Appl. No. 16/575,259 notified Dec. 18, 2020, 10 pgs.

\* cited by examiner

DIFFERENTIAL TO SINGLE-ENDED HIGH BANDWIDTH COMPENSATOR

CLAIM OF PRIORITY

This Application is a continuation of, and claims the benefit of priority to U.S. patent application Ser. No. 16/575,259, filed on Sep. 18, 2019, titled "DIFFERENTIAL TO SINGLE-ENDED HIGH BANDWIDTH COMPENSATOR," which is incorporated by reference in entirety.

BACKGROUND

An on-die voltage regulator (VR), such as fully integrated on-die VR (FIVR), works with smaller inductance (L) and capacitance (C) values to enable on-die integration compared to larger L and C values used in traditional off-die motherboard VRs. The inductor and capacitor together have an LC resonant frequency. The LC resonant frequency can be as can be in the order of 10's of MHz. For faster transient response and for smaller voltage droops on the output supply node, the VR loop bandwidth should be higher than the LC resonant frequency. A compensator is used between the output supply node (coupled to the inductor and capacitor) and the controller of the VR. This compensator is used to compensate for phase loss associated with the LC filter and to extend the VR loop bandwidth beyond the LC resonant frequency. However, existing compensators have low performance in that they occupy large area and result in excessive latency in voltage transitions. The problem becomes prevalent when a system-on-chip (SoC) has 10 s of VRs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
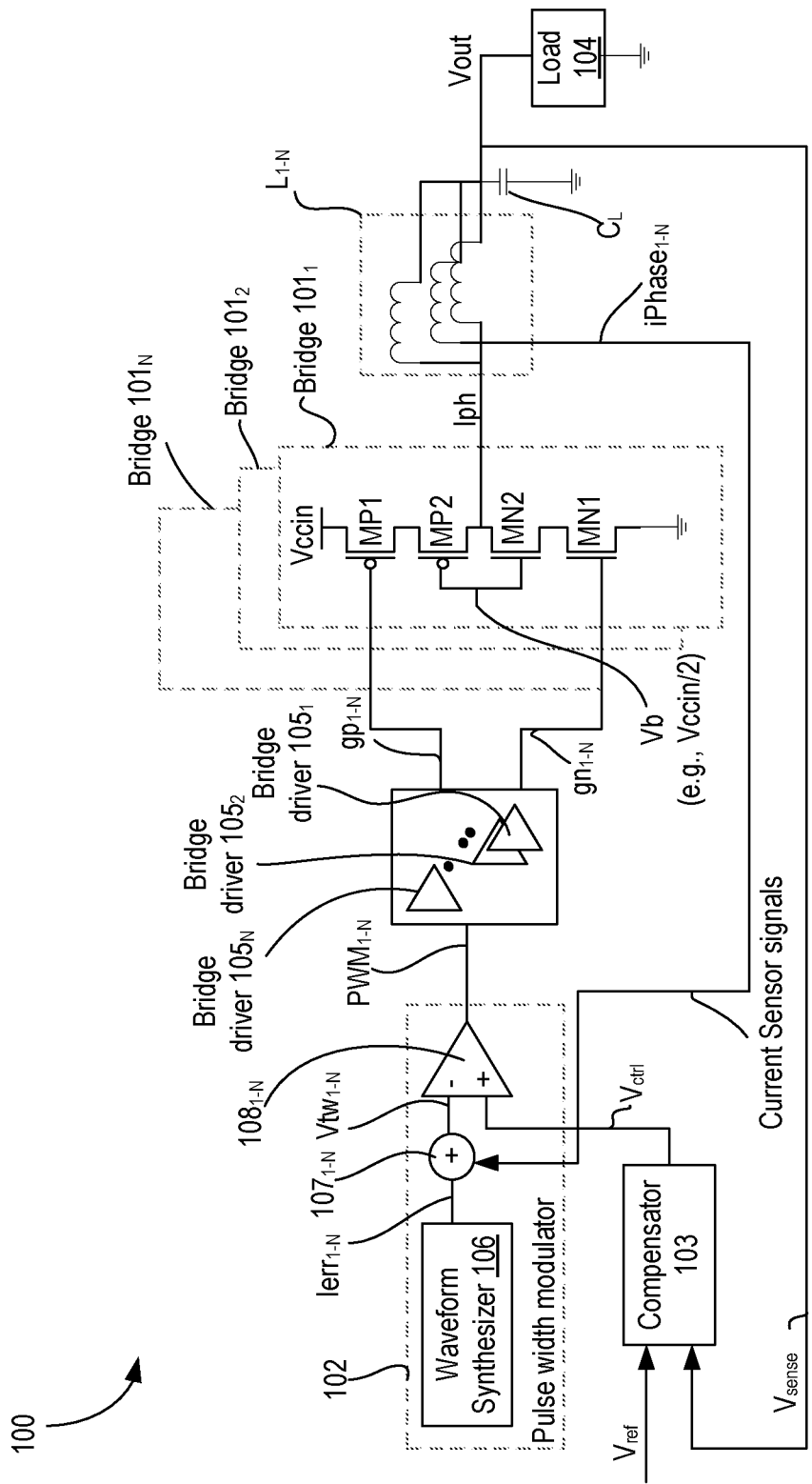
FIG. 1 illustrates a voltage regulator (VR) with a type-III compensation circuitry having higher bandwidth and lower power than traditional type-III compensators, in accordance with some embodiments.

Some embodiments describe a type-III differential-to-single-ended compensator. The compensator includes differential error amplifier that provides DC voltage tracking with respect to a reference voltage; resistor(s) and capacitors to compensate for phase loss and to shape the FIVR loop response; and configurable capacitors with capacitor values chosen depending on changing load conditions or number of active bridges. In some embodiments, the remaining capacitors that are not connected to the signal path are pre-charged to a known voltage by a pre-charge circuitry. Controllable switches provide the configurability of capacitance. Fuses, configuration registers, lookup table, operating system, etc. control the switches dynamically, at boot time, between change of power states, etc. In some embodiments, the type-III differential-to-single-ended compensator is re-configured into a type-II compensator via a control switch. One or more fuses, configuration registers, lookup table, operating system, etc. sets the logic condition of the control switch to change the compensator type.

Here, the term compensate generally refers to a circuitry that compensates for phase loss of a device. For example, in FIVR, type-III compensator compensates for the phase loss associated with an LC filter device coupled to the output node (Vout).

Here the term type-III generally refers to certain characteristics of a compensation network. A typical Type-III compensation network has three poles including one pole at the origin and two zeros in its transfer function.

Here the term type-II generally refers to certain characteristics of a compensation network. A typical Type-II compensation network has two poles including one pole at the origin and one zero in its transfer function.

There are many technical effects of various embodiments. For example, the type-III compensator consumes lower area than traditional type-III or type-II differential compensator (e.g., 40% lower area). The compensator of various embodiments reduces the number of passive devices needed to compensate an input signal. The high bandwidth compensator of various embodiments allows for faster power state and/or voltage transitions. For example, a pre-charge technique is applied to handle faster power state transitions that enables aggressive dynamic voltage and frequency scaling (DVFS) and voltage transitions. The compensator of various embodiments is configurable in that it can operate in voltage mode or current mode. As such, the same compensator can be used in SORT testing on a prepackaged part (of voltage regulators) during high volume manufacturing (HVM), thereby reducing time-to-market and cost. The compensator of various embodiments provides accurate reference tracking with very less temperature sensitivity and provides phase compensation to extend FIVR loop bandwidth beyond the LC resonant frequency. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom." "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a voltage regulator (VR) 100 with a type-III compensation circuitry having higher bandwidth and lower power than traditional type-III compensators, in accordance with some embodiments. In some embodiments, VR 100 comprises a plurality of bridges $101_{1-N}$, where 'N' is greater than one, a pulse width modulator (PWM) 102, and a compensator 103.

In some embodiments, plurality of bridges $101_{1-N}$ are coupled to a plurality of inductors $L_{1-N}$ which in turn are coupled to a load capacitor (or decoupling capacitor) $C_L$, and load 104. The voltage Vout on the capacitor is the regulated output voltage. In some embodiments, compensator 103 receives a reference voltage Vref and the output voltage Vout ($V_{sense}$) or a divided down version of Vout to generate a modified reference voltage Vctrl (feedback voltage) for PWM 102. While the embodiments are illustrated with a plurality of bridges and other components (e.g., where N is greater than one), they are not limited to such. For example, N can be zero, which includes a single bridge, single inductor, single bridge driver etc. As such, VR 100 can have one or more bridges, one or more inductors, one or more bridge drivers, one or more PWMs, etc.

In some embodiments, each bridge comprises a high-side switch and a low-side switch, both of which are controllably by one or more bridge drivers 105. In this example, the high-side switch comprises transistor MP1 while the low-side bridge comprises transistors MN1 coupled in series. In some embodiments, additional transistors MP2 and MN2 are coupled in series between transistors MP1 and MN1 to provide resistance. In some embodiments, transistors MP2 and MN2 are biased by Vb. In one example Vb=Vccin/2, where Vccin is an input power supply. In other embodiments, other values of Vb can be used. In some embodiments, output of each of the bridges of plurality of bridges $101_{1-N}$ is coupled to an inductor L from among the plurality of inductors L-N. For example, inductor $L_1$ is coupled to bridge $101_1$, inductor $L_2$ is coupled to bridge $101_2$, and so on. In some embodiments, a plurality of current sensors (not shown) are coupled to plurality of bridges $101_{1-N}$ and are operable to sense current $iPhase_{1-N}$ for each bridge (or phase).

In some embodiments, PWM (pulse width modulator) 102 generates a plurality of pulse width modulated signals, $PWM_{1-N}$ signals, for timing control and bridge drivers $105_{1-N}$. In some embodiments, outputs $gn_{1-N}$ and $gp_{1-N}$ of timing control and bridge drivers $105_{1-N}$ are used to control plurality of bridges $101_{1-N}$ to generate the regulated voltage Vout. In some embodiments, PWM 102 comprises wave synthesizer 106, current mixer $107_{1-N}$, and comparator $108_{1-N}$. In some embodiments, wave synthesizer 106 (also referred as wave generator) generates 'N' number of triangular waves. These triangular waves are periodic and have a voltage swing between Vh (high voltage threshold) and Vl (low voltage reference).

Buck converter 100 contains a feedback loop formed of a sense line, compensator, pulse width modulator (PWM), signaling to the power train, etc., to keep the output voltage Vout close to a set reference voltage Vref. The output voltage Vout is the voltage provided to load 104. The compensator in voltage-mode-control buck converters is usually a classic type-3 compensator using either discrete or precision integrated passive resistor and capacitor components. The bandwidth of a conventional compensator is up to approximately 1 MHz.

A compensator for Integrated Voltage Regulators (IVR) differs from conventional compensators in that it operates at much higher bandwidths (e.g., greater than 50 MHz). The compensator for IVR is subjected to much higher noise levels on the die (coupled through the substrate, power supplies, and surrounding/crossing signals). The compensator for IVR have pole and zero frequencies that are desired to be on-die configurable in wide ranges. The resistor and capacitor components of the compensator have relatively large parasitic capacitance and resistance and vary across process corners, and voltage levels are limited to the process Vmax, which is, for example, approximately IV or less in a typical digital lead process.

Some embodiments describe a fully differential design for compensator 103, which has no (or substantially zero) first-order sensitivity to substrate noise or common-mode noise on sense lines or reference lines.

In some embodiment, the fully differential design supports output voltages higher than the process Vmax. Here "Vmax" refers to the highest voltage level that can be applied to a transistor overtime without causing reliability issues. In some embodiment, the fully differential design is configurable in wide ranges for various parameters. In one embodiment, the fully differential design includes DFT (Design-for-Test) features for closed-loop testing at sort (where inductors are not connected yet) and to characterize the frequency response.

In some embodiments, compensator 103 comprises a circuitry to receive a voltage of capacitor $C_L$, or a version of the voltage of capacitor $C_L$, and a reference (e.g., $V_{ref}$). The circuitry generates an output $V_{ctrl}$ that is to modify a characteristic of a modulation signal. The characteristic can be duty cycle, low or high thresholds, amplitude, slew rate, etc. of PWM signals from comparator $108_{1-N}$. In some embodiments, the circuitry comprises a differential to single-ended circuitry and a compensation circuitry (e.g., type-III compensator) coupled to an output of the differential to single-ended circuitry, wherein the output of the compensation circuitry is the output of the circuitry.

The differential to single-ended output is given by $(V_{sense}-G_{sense})/2$ and type III compensation block or circuitry provides DC tracking. Here, $V_{sense}$ refers to the load voltage sensed at the load or the output of the VR (e.g., voltage on the load capacitor) or a version of the output of VR (e.g., a divided down voltage by use of a resistor divider). Here, $G_{sense}$ refers to a ground voltage of the VR or ground voltage sensed at the load. The differential-to-single-ended circuitry has higher bandwidth so that it contributes a minimal (or zero or substantially zero) phase loss within the loop bandwidth of the FIVR. Here, high bandwidth refers to a frequency greater than 250 MHz. To ensure higher bandwidth of the differential-to-single-ended circuitry, a capacitor divider is used to avoid phase loss, which is incurred at higher frequencies from an amplifier of the differential-to-single-ended circuitry.

In some embodiments, the differential to single-ended circuitry comprises an amplifier having a first input coupled to a first resistor divider, wherein the first resistor divider is to receive the voltage of capacitor $C_L$, or the version of the voltage of capacitor $C_L$ or the voltage sensed at the load. In some embodiments, amplifier comprises a second input coupled to second resistor divider, wherein the second resistor divider is to receive a voltage from a ground (e.g., ground at the load sense location). In some embodiments, an output of the amplifier is coupled to a resistor. In some embodiments, the resistor is coupled to the compensation circuitry.

Figure 4:
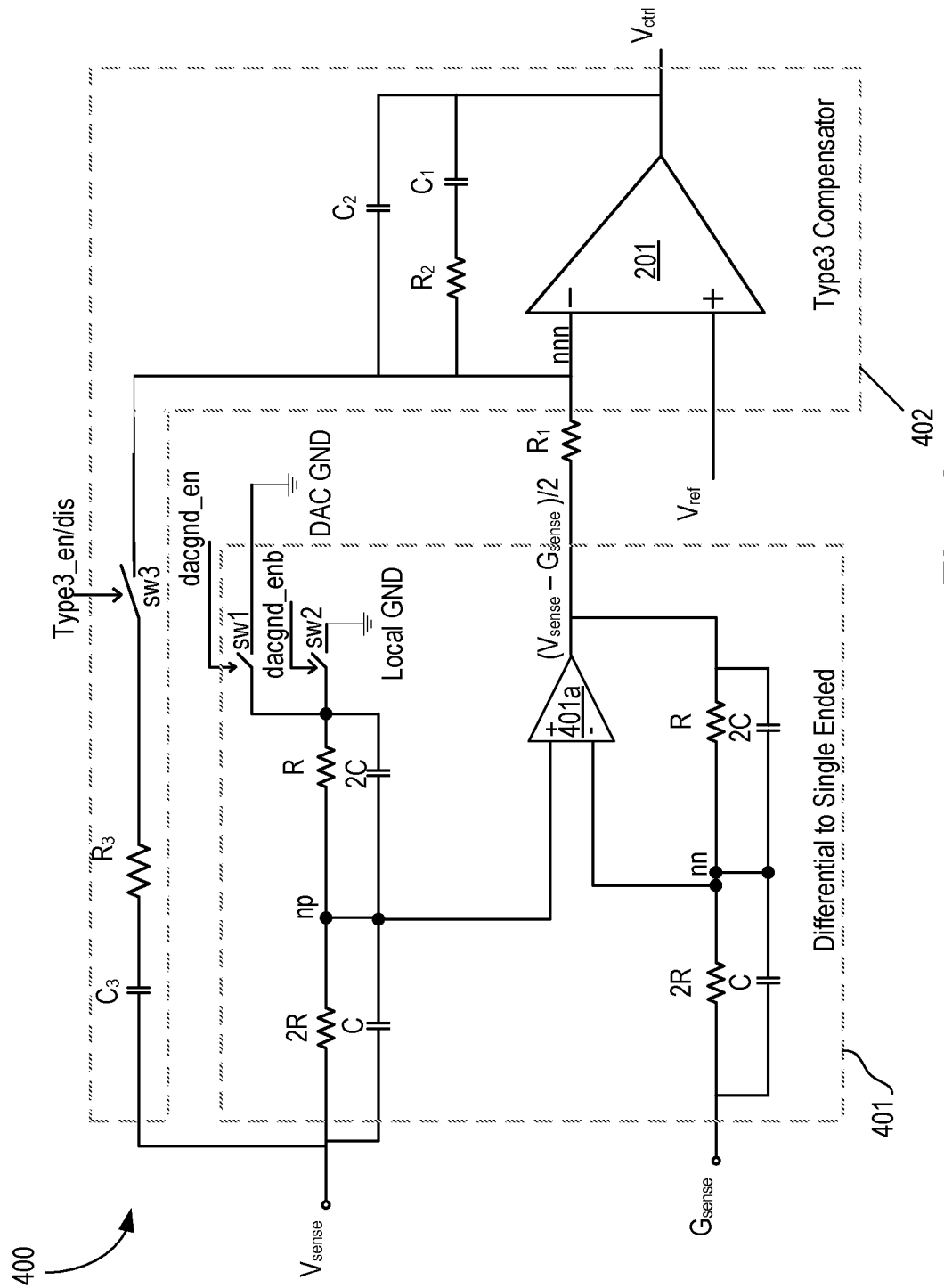
FIG. 4 illustrates a differential-to-singled-ended type-III compensation circuitry, in accordance with some embodiments.
Figure 5:
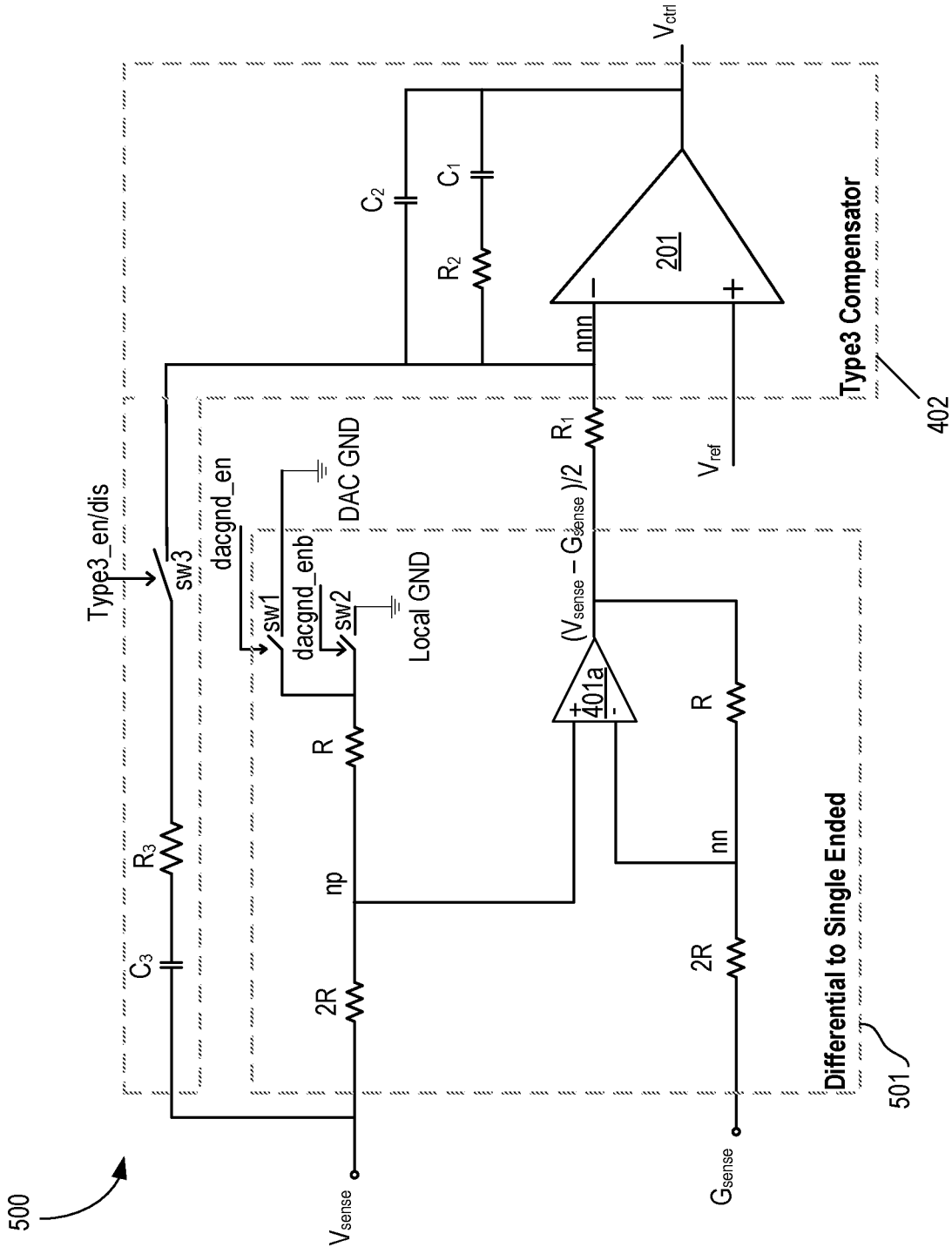
FIG. 5 illustrates a differential-to-singled-ended type-III compensation circuitry, in accordance with some embodiments.
Figure 6:
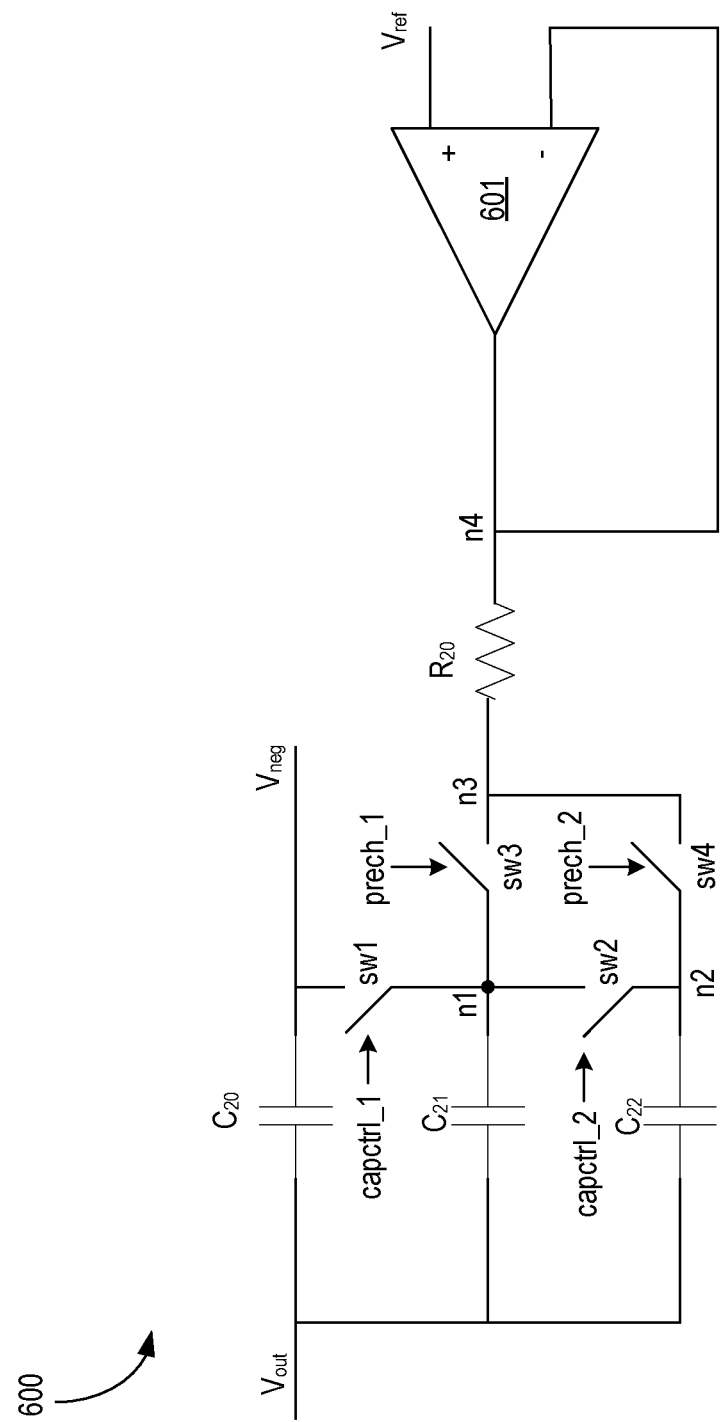
FIG. 6 illustrates a pre-charge circuitry for a type-III compensation circuitry, in accordance with some embodiments.

In some embodiments, compensator 103 comprises a pre-charge circuitry to prevent voltage droop on Vout during power state transitions or change in voltage identification (VID). FIG. 4 and FIG. 5 illustrate examples of compensator circuit, while FIG. 6 illustrates an example of the pre-charge circuitry.

Referring back to FIG. 1, in some embodiments, comparator $108_{1-N}$ generates 'N' number of PWM signals (i.e., $PWM_{1-N}$ signals), each of which drives a corresponding timing control and bridge driver from among timing control and bridge drivers $105_{1-N}$. In one embodiment, PWM signals (i.e., $PWM_{1-N}$ signals) have a duty cycle, which varies with DC levels of inputs to comparators $108_{1-N}$. The strength of current output by bridges $101_{1-N}$, ripple in current, and voltage Vout depends on the duty cycle of $PWM_{1-N}$ signals.

In one embodiment, current mixers $107_{1-N}$ receives sensed phase currents (iPhase$_{1-N}$) of each bridge from among bridges $101_{1-N}$ and subtracts average current from all bridges $101_{1-N}$ to generate error currents ierr$_{1-N}$ which is used to generate corresponding voltage Vtw$_{1-N}$ for inputs of corresponding comparators $108_{1-N}$. For example, current mixer 107, receives iPhase$_1$ from bridge 101, and subtracts average current from iPhase$_1$ to generate ierr$_1$ which is used to generate Vtw$_1$ for comparator 108$_1$. In such an embodiment, output current of all bridges $101_{1-N}$ is substantially balanced resulting in phase balancing.

In some embodiments, current sensor signals (iPhase$_{1-N}$) are combined and added (or subtracted) by current mixers $107_{1-N}$ to the main VR loop at the junction of output of waveform synthesizer 106 and comparators $108_{1-N}$. In such an embodiment, the main VR loop (including PWM 102→bridge drivers $105_{1-N}$→bridges $101_{1-N}$→compensator 103) regulates the output voltage Vout while the current sensing loop (including current mixers $107_{1-N}$→comparators $108_{1-N}$→bridge drivers $105_{1-N}$→bridges $101_{1-N}$→current sensors (not explicitly shown)) checks and maintains that all phases (i.e., bridges $101_{1-N}$) generate the same amount of current.

The triangle wave (i.e., output of waveform synthesizer 106) of each phase (or bridge) is shifted up or down by an amount proportional to $I_{en}=I_{ph}-I_{avg}$, where $I_{err}$ is the difference between the individual phase's current and the average current of all the phases. In one embodiment, shifting the triangle wave up reduces the PWM duty cycle which decreases phase current, and shifting the triangle wave down increases the PWM duty cycle which increases phase current (i.e., from output of bridge from among bridge $101_{1-N}$).

Figure 2:
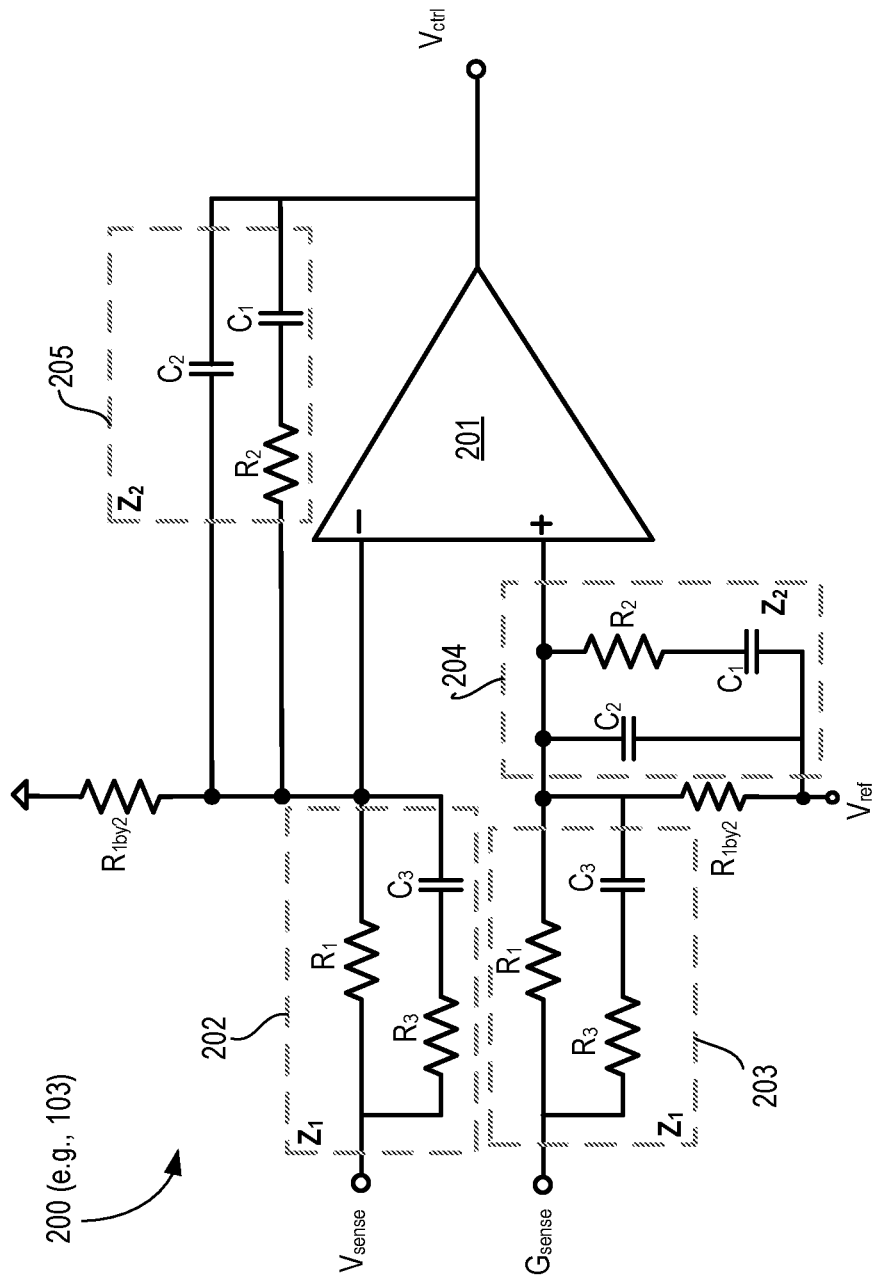
FIG. 2 illustrates a type-III compensation circuitry with differential passives.

FIG. 2 illustrates a type-III compensation circuitry 200 with differential passives. Circuitry 200 comprises amplifier 201, differential passive blocks 202 and 203, filter 204, and feedback block 205 coupled as shown. Passive block 202 comprises resistors $R_1$ and $R_3$, and capacitor $C_3$. Passive block 203 comprises resistors $R_1$ and $R_3$, and capacitor $C_3$. Passive block 204 comprises capacitors $C_2$ and $C_1$, and resistor $R_2$. Feedback block 205 comprises capacitors $C_2$ and $C_1$, and resistor $R_2$. $R_{1by2}$ (e.g., half the size of resistor $R_1$ in terms of resistance) is coupled to $V_{ref}$, capacitor $C_2$, capacitor $C_1$, Capacitor $C_3$, resistor $R_1$ and amplifier 201. Input $V_{sense}$ is received by passive block 202. Input $G_{sense}$ is received by passive block 203.

The transfer function of the type-III compensator is given as:

$$\frac{V_{ctrl}}{V_{sense}} = \frac{1}{sC_1R_1}\left(\frac{(sC_2R_2+1)(sC_2(R_1+R_2)+1)}{(sC_3R_3+1)\left(sC_2R_2+\left(1+\frac{C_2}{C_1}\right)\right)}\right) \quad (1)$$

Based on equation 1, two zeros and three poles are identified. The frequency (f) location of the poles (P) and zeros (Z) are given as:

$$f_{Z_1} = \frac{1}{2\pi(R_1+R_3)C_3} \quad (2)$$

$$f_{Z_2} = \frac{1}{2\pi R_2 C_1} \quad (3)$$

$$f_{P_1} = \frac{1}{s} \quad (4)$$

$$f_{P_2} = \frac{1}{2\pi R_2\left(\frac{C_1 C_2}{C_1+C_2}\right)} \quad (5)$$

$$f_{P_{32}} = \frac{1}{2\pi R_3 C_3} \quad (6)$$

Figure 3:
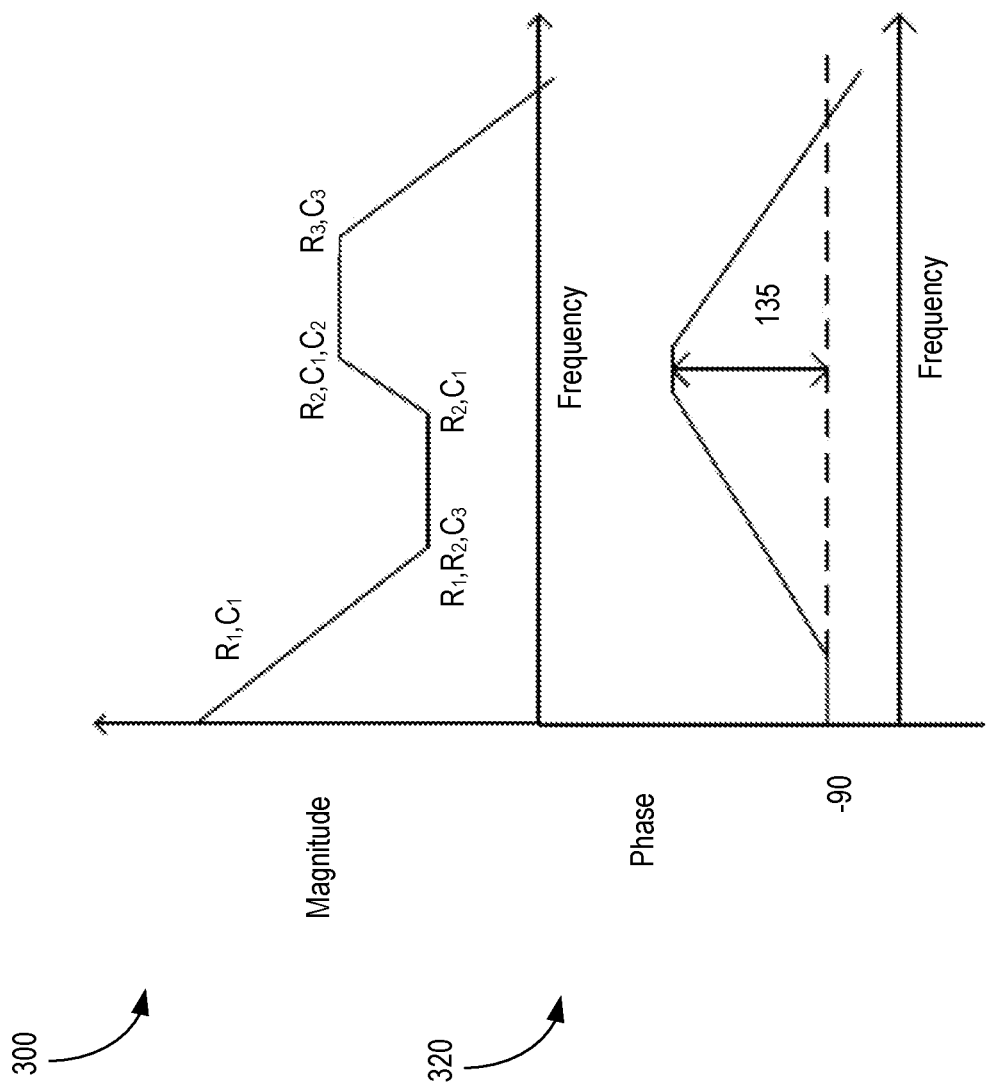
FIG. 3A-B illustrates magnitude and phase plots of the type-III compensation circuitry of FIG. 2.

FIG. 3A-B illustrates magnitude and phase plots 300 and 320, respectively, of the type-III compensation circuitry of FIG. 2.

FIG. 4 illustrates a differential-to-singled-ended type-III compensation circuitry 400, in accordance with some embodiments. Circuitry 400 comprises differential-to-single-ended stage 401 coupled to Type-III compensator 402. In some embodiments, differential-to-single-ended stage 401 comprises amplifier 401a having a first input coupled to $V_{sense}$ (e.g., Vout or its divided form) via a first resistor divider, and a second input coupled to a local ground ($G_{sense}$) for load 104 via a second resistor divider. The first resistor divider (comprising resistors 2R and R) is to receive the voltage of capacitor $C_L$, or the version of the voltage of capacitor $C_L$. The second resistor divider (comprising resistors 2R and R) is to receive a voltage from a ground (e.g., $G_{sense}$).

The output of amplifier 401a is a single-ended output, which is a difference of $V_{sense}$ relative to $G_{sense}$. This output is input to amplifier 201 of type-III compensator 402, which compares the output of amplifier 401a with $V_{ref}$. In various embodiments, the output of amplifier 401a is coupled to resistor $R_1$ which in turn is coupled to input nnn (or negative input) of amplifier (or comparator) 201 of Type-III compensator 402.

In some embodiments, stage 401 comprises two signal paths, $V_{sense}$ and $G_{sense}$. Input $V_{sense}$ is coupled to a resistive divider comprising resistors 2R and R, where resistor R is coupled to one of local ground (Local GND) or digital-to-analog converter (DAC) ground (DAC GND) via switches sw2 or sw1, respectively. Switch sw1 is controlled by dacgnd_en (DAC ground enable) while switch sw2 is controlled by dacgnd_enb (inverse of dacgnd_en). The dacgnd_en control signal allows circuitry 400 to account for ground voltage delta between compensator Local GND and DAC GND. In some embodiments, capacitors are coupled to the resistors. For example, capacitor C is coupled in parallel to resistor 2R while capacitor 2C is coupled in parallel to resistor R, where the two capacitors are also coupled in series. Node np coupling resistors 2R and R, and capacitors C and 2C is provided as a first input to amplifier 401a.

Input $G_{sense}$ is coupled to another resistive divider comprising resistors 2R and R. In some embodiments, capacitors are coupled to the resistors. For example, capacitor C is coupled in parallel to resistor 2R while capacitor 2C is coupled in parallel to resistor R, where the two capacitors are also coupled in series. Node nn coupling resistors 2R and R, and capacitors C and 2C is provided as a second input to amplifier 401a.

In some embodiments, when a digital-to-analog converter (DAC) that generates the $V_{ref}$ is physically located far enough from the compensator, there may be a potential difference between the compensator local ground and the DAC ground. In that case, switch sw1 is turned on (and switch sw2 is turned off) and the DAC ground (GND) is coupled to resistor R and capacitor 2C of the $V_{sense}$ signal path so that input voltage to amplifier 401a (node np) is ($V_{sense}$–DAC_Ground)/3. In some embodiments, when the DAC that generates $V_{ref}$ is physically in close proximity to the compensator such that the grounds of the DAC and the compensator are substantially the same (or identical), then switch sw1 is disabled and switch sw2 is enabled that couples the local ground to resistor R and capacitor 2C of the $V_{sense}$ signal path so that input voltage to amplifier 401a (node np) is ($V_{sense}$–Local_Ground)/3.

In some embodiments, switch sw3 is provided and controllable by Type3 en/dis. Switch sw3 provides configurability to choose between type III and type II operation modes. In type II mode, switch sw3 disconnects resistor $R_3$ and capacitor $C_3$ from the signal path thus eliminating zero ($Z_1$) and pole ($P_3$) from transfer function. Type II mode can be used during current mode control or SORT testing for DFT (design-for-test) on pre-packaged parts with integrated inductors. SORT testing with on-die RC filter in type II mode helps to identify any defects and saves packaging costs, in accordance with various embodiments.

The value of resistors in stage 401 is selected to minimize DC current drawn from $V_{sense}$ and capacitor values are selected to minimize phase loss and provide high bandwidth (e.g., greater than 250 MHz). When stage 401 operates in high bandwidth, $R_1$ behaves as a resistor in that the signal path through $R_1$ contributes minimal (or zero or substantially zero) phase loss with the loop bandwidth. To ensure higher bandwidth of stage 401, capacitors C and 2C (e.g., capacitor divider) are added to avoid phase loss, which is incurred at higher frequencies from amplifier 401a.

Amount of DC current drawn from $V_{sense}$ determines the DC offset error voltage at output Vout. This DC current drawn from $V_{sense}$ depends on the value of resistance $R_1$, which traditionally keeps changing based on load current. This issue, in some embodiments, is addressed with stage 401 by having a fixed and higher resistance value for resistor divider network on Vsense compared to resistance of resistor $R_1$. This helps in reducing and controlling the amount of current drawn from $V_{sense}$ as a result of which DC offset error is deterministic and minimal.

In some embodiments, Type-III compensator stage 402 comprises a first feedback path coupled a first input (node nnn) and an input ($V_{sense}$) of the differential to single-ended circuitry. As discussed here, $V_{sense}$ receives the voltage of capacitor $C_L$, or the version of the voltage of the capacitor $C_L$. In various embodiments, the first feedback path comprises switch sw3, resistor $R_3$ coupled in series with switch sw3, and capacitor C3 coupled to the input $V_{sense}$ of the differential to single-ended circuitry 401 and to the resistor $R_3$. In some embodiments, switch sw3 when enabled is to bypass differential to single-ended circuitry 401 and AC couple the high frequency content of $V_{sense}$ signal to the input of amplifier 201 (node nnn). As such, switch sw3 can configure circuitry 400 to operate as a type-II compensator. In one such embodiment, node nnnn is coupled to input $V_{sense}$ via switch sw3, resistor $R_3$ and capacitor $C_3$, where capacitor $C_3$ is coupled in series with resistor $R_3$. Switch sw3 is controllable by Type3_en/dis signal. When switch sw3 is open, circuitry 400 operates as differential-to-singled-ended type-II compensation circuitry. When switch sw3 is closed, circuitry 400 operates as type-III compensation circuitry. In some embodiments, circuitry 400 has programmable R, C values to support wide range of LC values for the VR (e.g., 15-20× range).

In various embodiments, compensation circuitry 402 comprises a second feedback path between the output $V_{ctrl}$ and the first input (node nnn) of the compensation circuitry. The second feedback path comprises: resistor R2; a capacitive circuitry $C_1$ coupled in series with resistor $R_2$; and a second capacitive circuitry $C_2$ coupled to the output of the compensation circuitry and the first input (node nnn). Here, capacitive circuitry $C_2$ is parallel to the series coupled resistor $R_2$ and capacitive circuitry $C_1$.

In some embodiments, the first, second, or third capacitive circuitries ($C_1$, $C_2$, or $C_3$, respectively) comprise a pre-charge circuitry. Ins some embodiments, the pre-charge circuitry includes: a unity gain amplifier (UGA) coupled to the reference Vref; a resistor coupled to the output of the unity gain amplifier, a plurality of capacitors; a plurality of first switches coupled to the plurality of capacitors, wherein at least one switch of the plurality of switches is to couple the output of the compensation circuitry with the first input via at least one of the plurality of capacitors; and a plurality of second switches which is to pre-charge at least one of the plurality of capacitors or to pre-charge the first input. One example of the pre-charge circuitry is illustrated with reference to FIG. 6. Resistor $R_{20}$ helps with improving the stability of unity gain amplifier 601 as the capacitance to be pre-charged can vary over a range of 100 fF (femto-Farad) to 4 pF (Pico Farad).

Referring back to FIG. 4, in various embodiments, Type-III compensator stage 402 provides DC tracking and Type-III functionality. In voltage mode control, FIVR output filter comprising of inductor (L) and capacitor (C) has complex conjugate poles resulting in a maximum phase loss of 180 degree. For a fast transient response and smaller droop on Vout, the bandwidth of the buck converter needs to be higher than the resonant frequency of LC. A Type III compensator with 2 zeros, near the resonance frequency of LC, provides phase boost to compensate for phase loss associated with the LC filter and extends FIVR loop bandwidth beyond the LC resonant frequency. Compared to circuitry 200, which has differential passives that consume large amount of area, circuitry 400 uses a stage 401 that converts differential signal to a single-ended signal thus eliminating the need of differential passives. In one example, circuitry 400 saves about 40% area compared to a differential type III compensator circuitry 200. On an average, each client SOC has about 10 FIVR per power supply domains and server SOC has 10's of FIVR per power supply domains. In those cases, area saved with circuitry 400 (e.g., 103) translates to a smaller FIVR footprint at SOC level.

The capacitors and resistors in circuitry 400 can be implemented in any suitable manner. For example, resistors can be special devices provided by a process node to be used as linear resistors. In another example, the resistors are implemented as transistors operating in linear region. In some embodiments, capacitors are implemented as transistors, metal fingers, ferroelectric material, metal-insulator-metal (MIM) capacitors, or a combination of them. The switches in circuitry 400 are implemented as n-type transistors, p-type transistors, or a combination of them.

FIG. 5 illustrates differential-to-singled-ended type-III compensation circuitry 500, in accordance with some embodiments. Circuitry 500 is similar to circuitry 400 but for the capacitor dividers that are coupled to $V_{sense}$ and $G_{sense}$ signal paths in circuitry 500. Here, differential to single-ended circuitry 501 is smaller in size than circuitry 401 due to fewer passive devices. Functionally, and technical effect wise, circuitry 500 is similar to circuitry 400.

FIG. 6 illustrates pre-charge circuitry 600 for a type-III compensation circuitry, in accordance with some embodiments. In some embodiments, circuitry 600 comprises amplifier 601, resistor $R_{20}$, capacitors $C_{20}$, $C_{21}$, and $C_{22}$, and switches sw1, sw2, sw3, and sw4. In this example, pre-charge circuitry 600 is illustrated as replacement of capacitor $C_2$ of any of circuitry 200, 400, or 500. However, circuitry 600 can replace any of the capacitors of circuitry 200, 400, and 500 in accordance with various embodiments.

Capacitor $C_{20}$ is coupled to nodes $V_{out}$ and $V_{neg}$. Capacitor $C_{21}$ is coupled Vout and n1. Capacitor $C_{22}$ is coupled $V_{out}$ and n2. Switch sw1 is controllable by capctrl_1 (capacitor control) and is coupled to nodes $V_{neg}$ and n1. Switch sw2 is controllable by capctrl_2 (capacitor control) and is coupled to nodes n1 and n2. Switch sw4 is controllable by prech2 (pre-charge) and is coupled to nodes n2 and n3. Switch sw3 is coupled to nodes n1 and n3, and is controllable by prech1 (pre-charge). Resistor $R_{20}$ is coupled to nodes n3 and n4. Amplifier 601 is configured in a unity gain configuration having one input output to its output (node n4) and another input to receive $V_{ref}$.

The capacitors and resistors in circuitry 600 can be implemented in any suitable manner. For example, resistors can be special devices provided by a process node to be used as linear resistors. In another example, the resistors are implemented as transistors operating in linear region. In some embodiments, capacitors are implemented as transistors, metal fingers, ferroelectric material, metal-insulator-metal (MIM) capacitors, or a combination of them. The switches in circuitry 400 are implemented as n-type transistors, p-type transistors, or a combination of them.

As shown in FIG. 6, un-driven capacitance (e.g., is pre-charged to $V_{ref}$ value using pre-charge amplifier 601. This helps to prevent droops at VR output Vout during power state transitions and VID changes.

Figure 7:
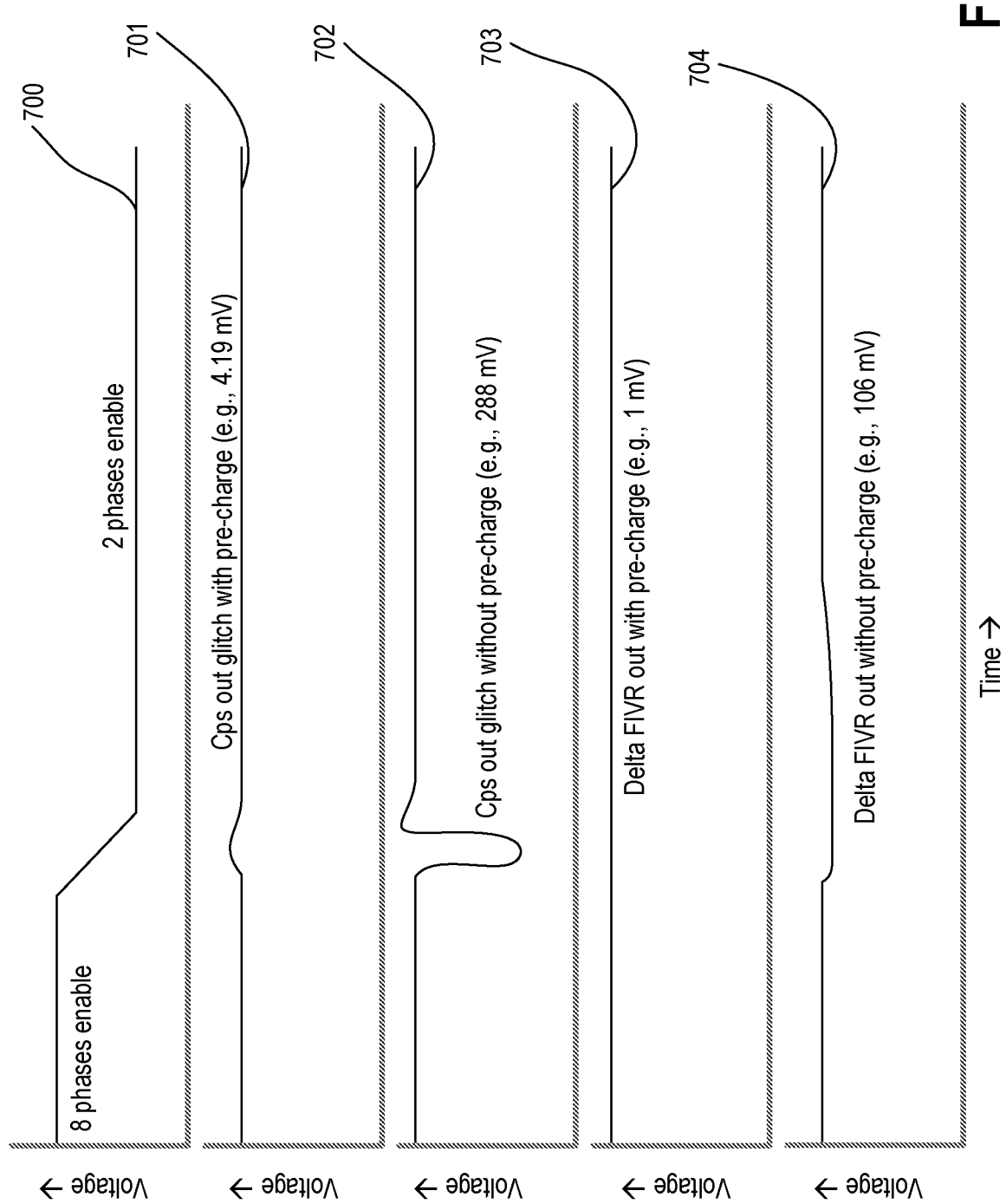
FIG. 7 illustrates a plurality of plots showing an output droop with and without pre-charge, in accordance with some embodiments.

FIG. 7 illustrates a plurality of plots showing an output droop with and without pre-charge, in accordance with some embodiments. The plots show simulation results of VR output Vout with and without pre-charge enabled. Waveform 700 illustrates change in loading condition in load 104, which causes the VR to reduce number of enabled phases (bridges). In this example, the number of active phases reduces from 8 to 2. Waveform 701 illustrates the glitch on Vout when pre-charge circuitry 600 is enabled. In this example, the glitch is about 4.19 mV when the number of phases reduces. Waveform 702 illustrates the glitch on Vout when pre-charge circuitry 600 is disabled or not present. In this example, the glitch is about 288 mV when the number of phases reduces.

As can be seen from simulation data without pre-charge, droop is 106 mV (waveform 704) and with pre-charge (waveform 703) droop is about 1 mV at Vout. As such, pre-charge circuitry 600 enables DVFS (dynamic voltage frequency scaling) with minimal latency. Also minimizing droops helps in reducing Vmin guard banding. This in turn helps in dynamic power savings and leakage reduction. Here, Vmin refers to minimum operating voltage below which the circuit and logic is not functional.

Figure 8:
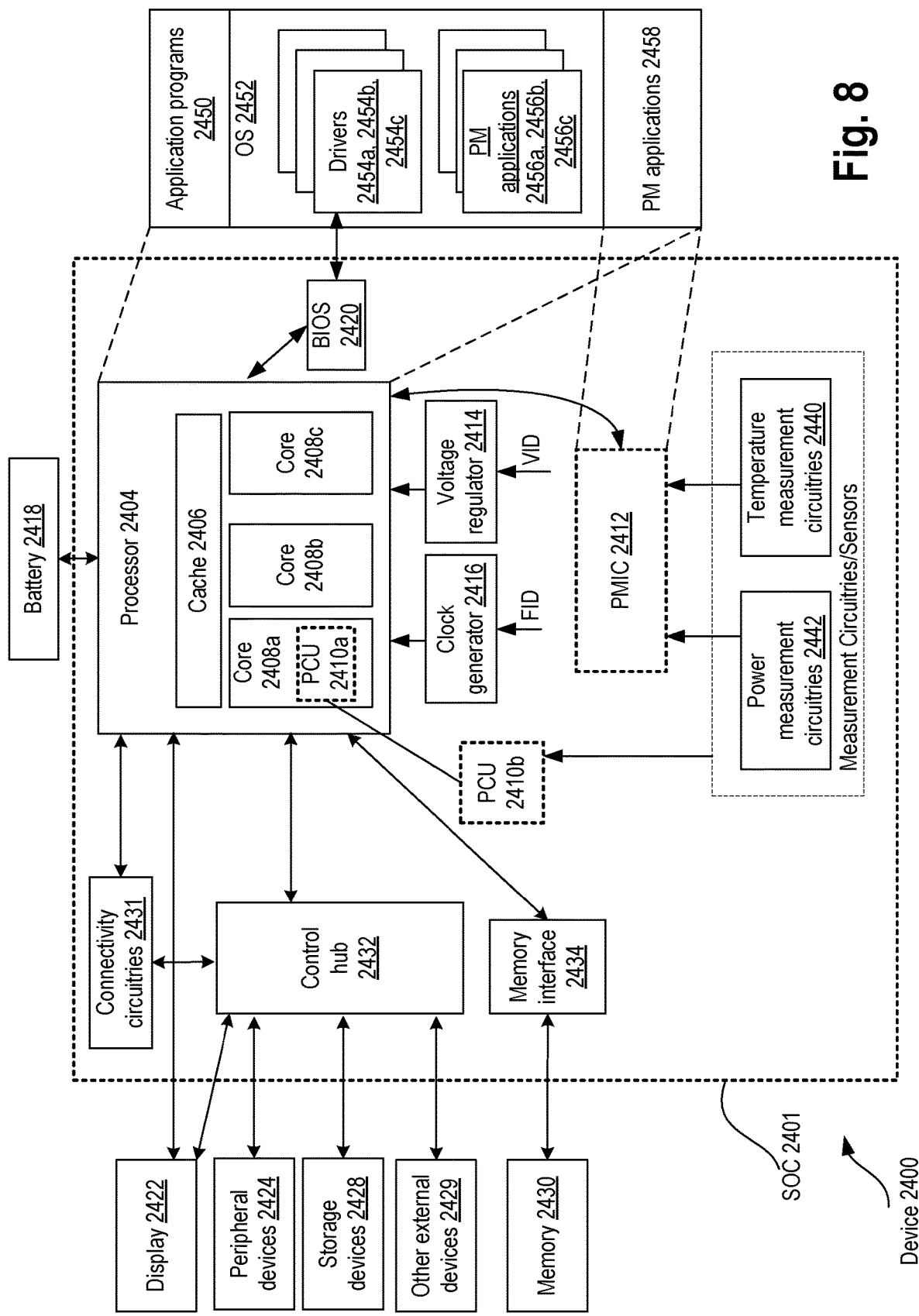
FIG. 8 illustrates a smart device, or a computer system, or a SoC (System-on-Chip) with a VR having a high bandwidth and low power differential-to-single-ended type-III compensator, according to some embodiments of the disclosure.

FIG. 8 illustrates a smart device, or a computer system, or a SoC (System-on-Chip) with a VR having a high bandwidth and low power differential-to-single-ended type-III compensator, according to some embodiments of the disclosure. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 15, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408*a*, 2408*b*, 2408*c*. Although merely three cores 2408*a*, 2408*b*, 2408*c* are illustrated, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS)

which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414 VR having a high bandwidth and low power differential-to-single-ended type-III compensator. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2410a/b and/or PMIC 2412. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals. Clock generator 2416 is an adaptive clock source that can provide an adaptive frequency output as discussed with reference to various embodiments.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 (e.g., SCVR) and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: an apparatus comprising: one or more bridges where an individual bridge includes a high-side switch and a low-side switch; one or more inductors coupled to the one or more bridges; a capacitor coupled to the one or more inductors and to a load; and a circuitry to receive a voltage of the capacitor, or a version of the voltage of the capacitor, and a reference, wherein the circuitry is to generate an output which is to modify a characteristic of a modulation signal, wherein the circuitry comprises a differential to single-ended circuitry and a compensation circuitry coupled to an output of the differential to single-ended circuitry, and wherein the output of the compensation circuitry is the output of the circuitry.

Example 2: The apparatus of example 1, wherein the differential to single-ended circuitry comprises: an amplifier having: a first input coupled to a first resistor divider, wherein the first resistor divider is to receive the voltage of the capacitor, or the version of the voltage of the capacitor, and a second input coupled to second resistor divider, wherein the second resistor divider is to receive a voltage from a ground.

Example 3: The apparatus of example 2, wherein an output of the amplifier is coupled to a resistor.

Example 4: The apparatus of example 3, wherein the resistor is coupled to the compensation circuitry.

Example 5: The apparatus of example 4, wherein compensation circuitry comprises an amplifier having a first input coupled to the resistor, and a second resistor to receive the reference.

Example 6: The apparatus of example 5, wherein the compensation circuitry comprises a first feedback path coupled the first input and an input of the differential to single-ended circuitry, wherein the input is to receive the voltage of the capacitor, or the version of the voltage of the capacitor.

Example 7: The apparatus of example 5, wherein the first feedback path comprises a switch, a resistor coupled in series with the switch, and a capacitor coupled to the input of the differential to single-ended circuitry and to the resistor.

Example 8: The apparatus of example 7, wherein the switch when enabled is to bypass the differential to single-ended circuitry.

Example 9: The apparatus of example 6, wherein the compensation circuitry comprises a second feedback path between the output of the compensation circuitry and the first input of the compensation circuitry, wherein the second feedback path comprise: a resistor, a first capacitive circuitry coupled in series with the resistor, and a second capacitive circuitry coupled to the output of the compensation circuitry and the first input.

Example 10: The apparatus of example 9, wherein the first or second capacitive circuitries comprise a pre-charge circuitry, wherein the pre-charge circuitry includes: a unity gain amplifier coupled to the reference; a resistor coupled to the output of the unity gain amplifier; a plurality of capacitors; a plurality of first switches coupled to the plurality of capacitors, wherein at least one switch of the plurality of switches is to couple the output of the compensation circuitry with the first input via at least one of the plurality of capacitors; and a plurality of second switches which is to pre-charge at least one of the plurality of capacitors or to pre-charge the first input.

Example 11: An apparatus comprising: a bridge including a high-side switch and a low-side switch; an inductor coupled to the bridge; a capacitor coupled to the inductor and to a load; and a compensation circuitry coupled to the capacitor, wherein the compensation circuitry is to mitigate a voltage droop on the capacitor, wherein the compensation circuitry includes a differential to single-ended circuitry coupled to an amplifier.

Example 12: The apparatus of example 11, wherein the compensation circuitry is to receive a voltage of the capacitor, or a version of the voltage of the capacitor, and a reference, and wherein the compensation circuitry is to generate an output, which is to modify a characteristic of a modulation signal, that is to drive the bridge.

Example 13: The apparatus of example 12, wherein the amplifier is coupled to an output of the differential to single-ended circuitry, and wherein an output of the amplifier is the output of the compensation circuitry.

Example 14: The apparatus of example 13, wherein the amplifier is a first amplifier, and wherein the differential to single-ended circuitry comprises: a second amplifier having: a first input coupled to a first resistor divider, wherein the first resistor divider is to receive the voltage of the capacitor, or the version of the voltage of the capacitor; and a second input coupled to second resistor divider, wherein the second resistor divider is to receive a voltage from a ground.

Example 15: The apparatus of example 12, wherein the amplifier is coupled to a capacitive circuitry which is to pre-charge an input of the amplifier.

Example 16: The apparatus of example 15, wherein the capacitive circuitry comprises: a unity gain amplifier coupled to a reference; a resistor coupled to the output of the unity gain amplifier; a plurality of capacitors; a plurality of first switches coupled to the plurality of capacitors, wherein at least one switch of the plurality of switches is to couple the output of the amplifier with a first input of the amplifier via at least one of the plurality of capacitors; and a plurality of second switches which is to pre-charge at least one of the plurality of capacitors or to pre-charge the first input. In some embodiments, if all capacitors are used by the compensator, then pre-charge circuit may not have any capacitors to pre-charge.

Example 17: A system comprising: a processor core; a voltage regulator coupled to the processor core, wherein the voltage regulator comprises: a bridge including a high-side switch and a low-side switch; an inductor coupled to the bridge; a capacitor coupled to the inductor and to the processor core; and a compensation circuitry coupled to the capacitor, wherein the compensation circuitry is to mitigate a voltage droop on the capacitor, wherein the compensation circuitry includes a differential to single-ended circuitry coupled to an amplifier; and a wireless interface to allow the processor core to communicate with another device.

Example 18: The system of example 17, wherein the amplifier is coupled to a capacitive circuitry which is to pre-charge an input of the amplifier.

Example 19: The system of example 18, wherein the capacitive circuitry comprises: a unity gain amplifier coupled to a reference; a resistor coupled to the output of the unity gain amplifier; a plurality of capacitors; a plurality of first switches coupled to the plurality of capacitors, wherein at least one switch of the plurality of switches is to couple the output of the amplifier with a first input of the amplifier via at least one of the plurality of capacitors; and a plurality of second switches which is to pre-charge at least one of the plurality of capacitors or to pre-charge the first input.

Example 20: The system of example 17, wherein the compensation circuitry is to receive a voltage of the capacitor, or a version of the voltage of the capacitor, and a reference, and wherein the compensation circuitry is to generate an output, which is to modify a characteristic of a modulation signal, that is to drive the bridge.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
   a differential to single-ended stage comprising a first input, a second input, and an output;
   a differential to single-ended compensator coupled to receive a voltage from the output of the differential to single-ended stage and to output a control voltage for a pulse width modulator of a buck converter; and
   a control switch coupled between the first input and the output of the differential to single-ended stage, wherein the differential to single-ended compensator is switchable via the control switch between a type-III compensator in a voltage control mode of the buck converter and a type-II compensator in a current control mode.

2. The apparatus of claim 1, wherein the differential to single-ended stage comprises:
   a first amplifier comprising a first input, a second input and an output;
   a first resistor coupled to the first input of the first amplifier and the first input of the differential to single-ended stage; and
   a second resistor coupled to the second input of the first amplifier and the second input of the differential to single-ended stage.

3. The apparatus of claim 2, wherein the differential to single-ended compensator comprises:
   a second amplifier comprising a first input, a second input and an output, wherein the first input of the second amplifier is coupled to the output of the first amplifier via a third resistor, the first input of the second amplifier is coupled to the control switch and a reference voltage is coupled to the second input of the second amplifier.

4. The apparatus of claim 3, wherein the differential to single-ended compensator further comprises:
   a feedback path from the output of the second amplifier to the first input of the second amplifier, wherein the feedback path comprises a series-coupled capacitor and resistor in parallel with a capacitor.

5. The apparatus of claim 1, wherein the control switch is turned off to switch the differential to single-ended compensator from the type-III compensator to the type-II compensator.

6. The apparatus of claim 1, wherein the control switch is turned off during testing of the apparatus.

7. The apparatus of claim 1, further comprising a resistor and a capacitor coupled in series with the control switch between the first input and the output of the differential to single-ended stage.

8. The apparatus of claim 1, wherein the first input receives a voltage sensed at an output of the buck converter and the second input receives a ground voltage.

9. The apparatus of claim 1, wherein the differential to single-ended compensator comprises:
   an amplifier comprising a first input coupled to the output of the differential to single-ended stage and to the control switch, second input to receive a reference voltage, and output; and
   a feedback path from the output of the amplifier to the first input of the amplifier, wherein the feedback path comprises a first capacitor coupled between the output of the amplifier and the first input of the amplifier, and a second capacitor and a resistor coupled in series between the output of the amplifier and the first input of the amplifier.

10. The apparatus of claim 1, wherein the type-II compensator is used during sort testing of the apparatus.

11. The apparatus of claim 1, further comprising a bridge driver coupled to an output of the pulse width modulator.

12. An apparatus, comprising:
    a differential to single-ended stage comprising a load voltage input, a ground voltage input, and a first amplifier, wherein the first amplifier comprises a first input coupled via a resistor to the load voltage input, a second input coupled via a resistor to the ground voltage input, and an output;
    a control switch in a first feedback path from the output of the first amplifier to the first input of the first amplifier, wherein the first feedback path comprises a resistor and a capacitor; and
    a differential to single-ended compensator comprising a second amplifier having:
       a first input coupled to the output of the first amplifier via a resistor and to the control switch,
       a second input coupled to a reference voltage,
       an output, and
       a second feedback path from the output of the second amplifier to the first input of the second amplifier,
    wherein the second feedback path comprises a series-coupled capacitor and resistor in parallel with a capacitor and the differential to single-ended compensator is switchable via the control switch between a type-III compensator and a type-II compensator.

13. The apparatus of claim 12, wherein the control switch is open to remove a zero and a pole from a transfer function of the differential to single-ended compensator.

14. The apparatus of claim 13, wherein the load voltage input receives a voltage sensed at a load of a voltage regulator.

15. The apparatus of claim 12, wherein the control switch is open during testing of the apparatus.

16. The apparatus of claim 12, wherein the output of the first amplifier is coupled to the second input of the first amplifier.

17. A buck converter, comprising: a pulse width modulator comprising a waveform synthesizer and a comparator, wherein the comparator comprises an inverting input, a non-inverting input and an output; one or more bridge drivers coupled to the output of the comparator; and a compensator having an output coupled to the non-inverting input of the comparator, wherein the compensator comprises: a differential to single-ended stage having a first input to receive a voltage sensed at a load of the buck converter, a second input to receive a ground voltage, and an output; a differential to single-ended compensator coupled to receive a voltage of the output of the differential to single-ended stage, and to provide a voltage at the output of the compensator; and a control switch coupled in a feedback path which extends between the first input and the output of the differential to single-ended stage, wherein the differential to single-ended compensator is switchable via the control switch between a type-III compensator and a type-II compensator; and wherein the differential to single-ended compensator is switchable via the control switch between the type-III compensator in a voltage control mode of the buck converter and the type-II compensator in a current control mode.

18. The buck converter of claim 17, wherein the control switch is turned off during testing.

19. The buck converter of claim 17, wherein the control switch disconnects the feedback path to switch the differential to single-ended compensator from the type-III compensator to the type-II compensator.

* * * * *

UNITED STATES PATENT AND TRADEMARK OFFICE
CERTIFICATE OF CORRECTION

PATENT NO. : 11,755,048 B2
APPLICATION NO. : 17/220802
DATED : September 12, 2023
INVENTOR(S) : Sergio Carlo Rodriguez et al.

It is certified that error appears in the above-identified patent and that said Letters Patent is hereby corrected as shown below:

In the Claims

Column 22
Line 33, "...control switch and a reference voltage" should read --... control switch, and a reference voltage--
Line 59, "control switch, second input..." should read --control switch, a second input...--
Line 60, "voltage, and output..." should read --voltage, and an output...--

Signed and Sealed this
Seventeenth Day of September, 2024

Katherine Kelly Vidal
*Director of the United States Patent and Trademark Office*